United States Patent [19]
Rose

[11] 3,930,295
[45] Jan. 6, 1976

[54] TOOL FOR FABRICATING DIODE ARRAY

[75] Inventor: Ralph E. Rose, San Jose, Calif.

[73] Assignees: Signetics Corporation, Sunnyvale; Watkins Johnson, Palo Alto, both of Calif.

[22] Filed: Mar. 4, 1974

[21] Appl. No.: 447,981

[52] U.S. Cl. .................. 29/203 P; 269/21; 269/40; 269/321 WE
[51] Int. Cl.² ......................................... B23P 19/04
[58] Field of Search .......... 29/203 P, 203 V, 203 J; 269/21, 40, 321 WE

[56] References Cited
UNITED STATES PATENTS

| | | | |
|---|---|---|---|
| 3,667,103 | 6/1972 | Petree | 29/203 P |
| 3,704,504 | 12/1972 | Koegler | 29/203 V |
| 3,737,998 | 6/1973 | Byrd | 29/203 P |
| 3,755,048 | 8/1973 | Schubert | 29/203 P |

Primary Examiner—Al Lawrence Smith
Assistant Examiner—Robert C. Watson
Attorney, Agent, or Firm—Flehr, Hohbach, Test, Albritton & Herbert

[57] ABSTRACT

A method for fabricating a semiconductor diode array, utilizing an alignment tool to precisely position a plurality of diodes so that they can be bonded into a precision array. The alignment tool and a method for fabricating the tool are also disclosed.

4 Claims, 12 Drawing Figures

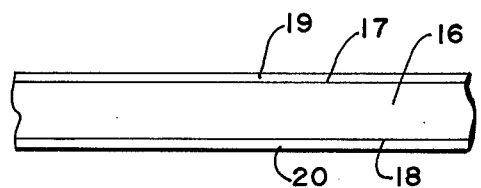
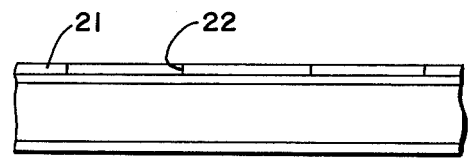
FIG.—1  FIG.—2
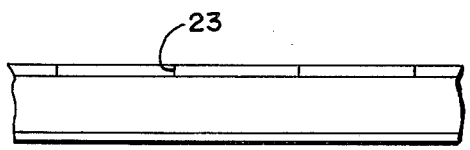
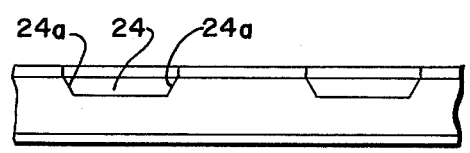
FIG.—3  FIG.—4
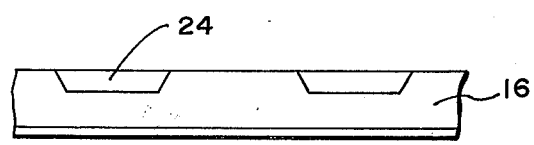
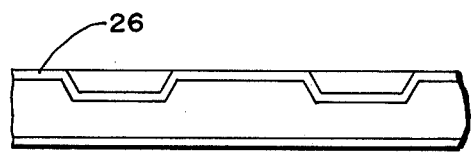
FIG.—5  FIG.—6
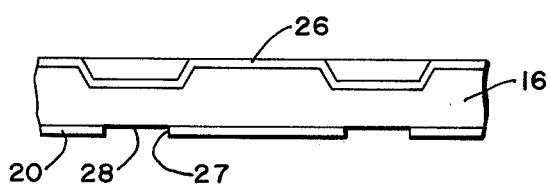
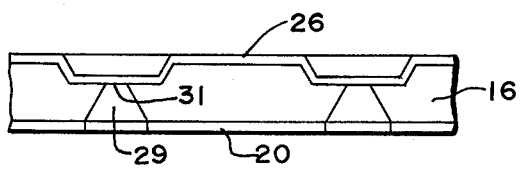
FIG.—7  FIG.—8
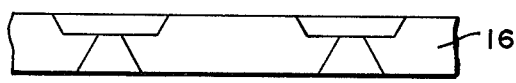
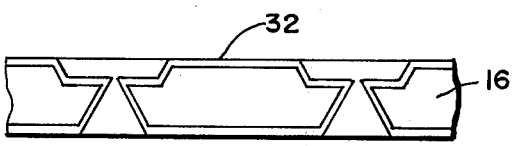
FIG.—9  FIG.—10

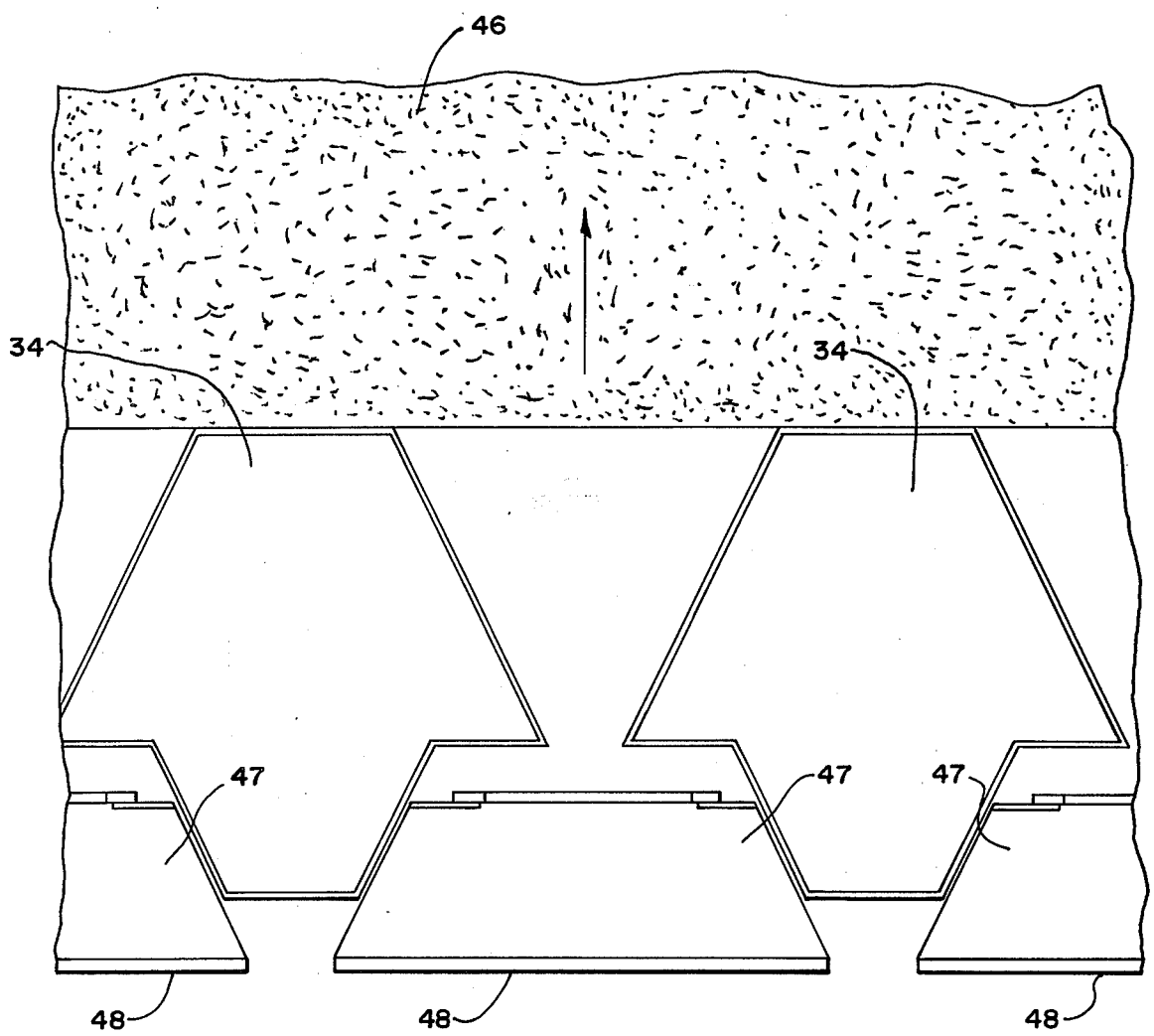
FIG.—12

TOOL FOR FABRICATING DIODE ARRAY

BACKGROUND OF THE INVENTION

The invention herein described was made in the course of work under a grant or award from the U.S. Army.

This invention relates generally to a method for fabricating a precisely aligned semiconductor array, and more particularly a method for alignment of semiconductor diodes using a tool and a method for fabrication of the tool.

Semiconductor applications frequently require precise alignment of a plurality of semiconductor devices spaced over a surface and configured as a large scale array. Many applications utilize an optical or electron beam which is caused to move from device to device in an array. The semiconductor devices are responsive to the beam as it impinges on individual semiconductor devices during its movement across the array. In an electron bombarded semiconductor (EBS) target, a semiconductor target including a plurality of reverse biased diodes is bombarded by an electron beam to obtain an output from the diodes that is representative of the linear distance over which the beam moves.

It is important in EBS applications that the device-to-device alignment be extremely precise so that the output from the diode array results solely from beam movement. Device-to-device misalignment may contribute substantial error in the output. In EBS applications it is necessary that adjacent devices, such as diodes in the present invention, be isolated from each other and further be very precisely aligned with respect to one another. In operation, an electron beam is swept across the diodes a very precise amount. If it is necessary to sweep the electron beam more than anticipated then power is wasted and less efficient operation results. Further, in certain applications, the devices may be connected in series and the spacing between diodes then become particularly critical as any variation in spacing will produce a corresponding variation in output impedance of the series connected devices. Thus it may not be possible to couple the semiconductor target into a load properly.

Prior art methods of providing a diode array include separating a plurality of diodes into individual dice with the die dimensions accurately controlled, such as by sawing. The dice are then individually aligned and bonded to a substrate. This technique, in reality, lacks the required precision because of the inherent limitations in the mechanical device which must step from one diode position to an adjacent diode position as devices are individually bonded on a one-by-one basis. The inherent limitations of mechanical one-by-one positioning become particularly acute when semiconductor dice must be placed very close together, on the order of one or two mils. Dice spacing of this order does not permit sufficient room to physically and rigidly grip each semiconductor die to prevent it from sliding while it is being bonded to a substrate.

SUMMARY OF THE INVENTION AND OBJECTS

Accordingly, it is an object of this invention to provide a method for fabricating precisely aligned arrays of semiconductor devices.

It is a more specific object of this invention to provide a method for fabricating a semiconductor diode array utilizing an alignment tool to precisely position a plurality of diodes so that they can be bonded into a precision array.

A further object of this invention is to provide an alignment tool for positioning diodes in an array and a method for fabricating the tool.

Briefly, in a specific embodiment of the invention, a diode array is fabricated using an alignment tool of the type having spaced recesses formed in a semiconductor body. The body is adapted to receive discrete diodes of the type having diode bonding pads so that the diode bond pads protrude above the surface of the body. An insulating substrate having a surface is provided and a metal layer formed on the surface of the substrate is patterned to correspond with the diode bond pads of the spaced diodes which have been positioned by the alignment tool. The substrate and patterned layer thereon is then heated to the melting temperature of the diode bond pads. The diode bond pads and the substrate pattern are aligned in a confronting relationship and are brought into contact. The substrate is allowed to cool and the tool is removed from the diode array formed on the substrate pattern.

DESCRIPTION OF THE DRAWINGS

FIGS. 1–10 show cross sectional views of a portion of a semiconductor body utilized as an alignment tool in accord with the present invention.

FIGS. 11 and 12 show the alignment tool having a plurality of diodes mounted therein, the tool placed in a holder and the combination placed in a conventional bonding apparatus.

DESCRIPTION OF THE PREFERRED EMBODIMENTS

Figure 11:
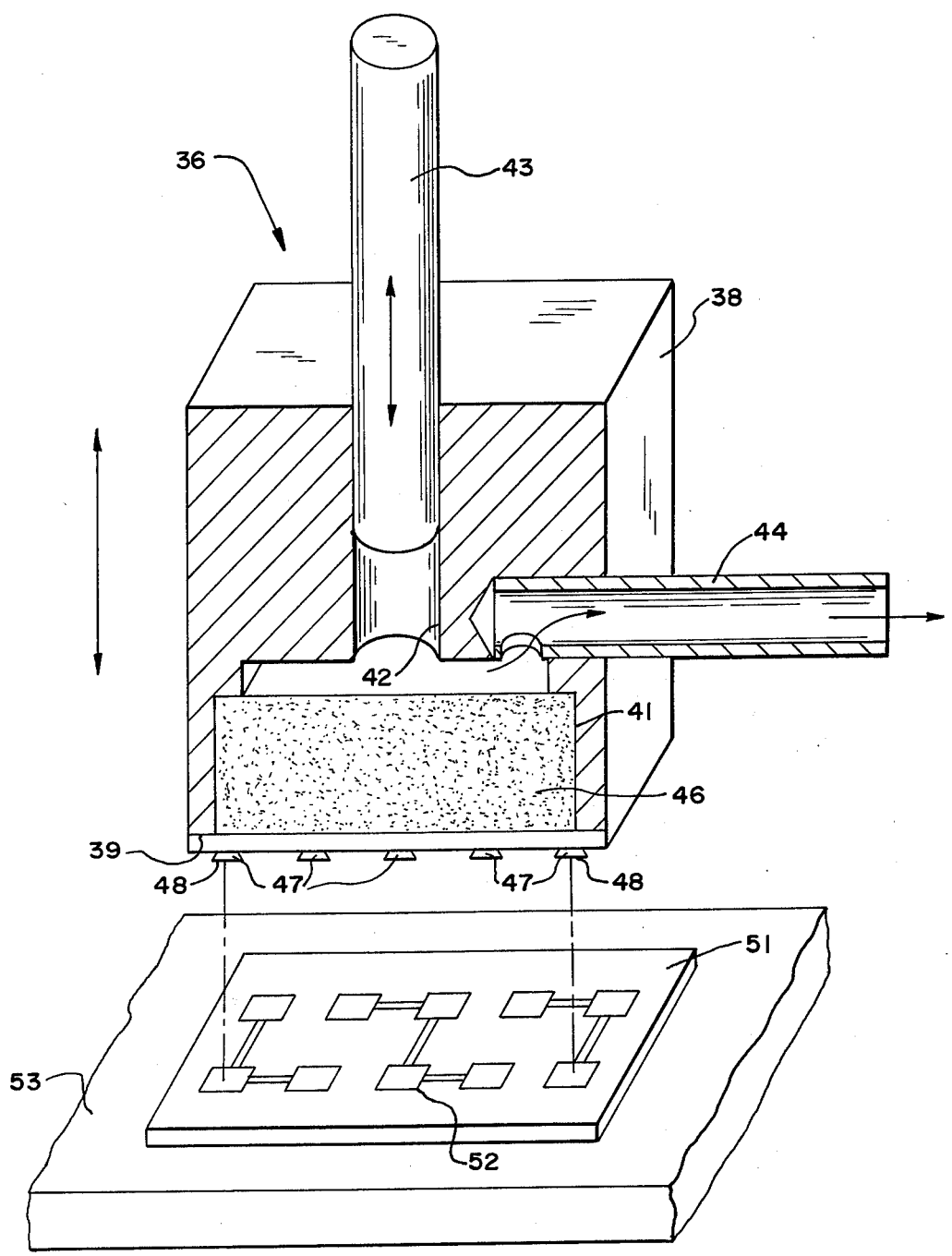

The method for bonding diodes in an array in accord with the present invention requires an alignment tool for positioning discrete diode during the bonding process. The starting material for the alignment tool is a semiconductor body or wafer 16, having a top planar surface 17 and a bottom planar surface 18, FIG. 1. The semiconductor body 16 may be of silicon material having a (100) orientation and having top and bottom planar surfaces ground and polished to provide a body thickness of from 10 to 12 mils.

Next a first protective layer 19 is formed on the top planar surface 17 and a layer 20 on the bottom planar surface 18. The protective layer may be an oxide of the semiconductor body having a thickness of 1 to 1.5 micrometers. Next the top protective layer 19 is masked with a pattern defining the diode size, thickness range and diode spacing corresponding to the diodes that the alignment tool is to position, FIG. 2. This may be a conventional step of applying a photoresist 21 to the top layer 19. Next the body is etched in the areas of the top protective layer 19, that are exposed by the conventional photoresist process to form masking windows, or apertures 23. This etching step may be accomplished by attaching the body to an inert substrate with wax, leaving the patterned side exposed and etching the thermal oxide in the exposed areas, FIG. 3.

The portions of the semiconductor body which are exposed after the etching process, are then etched through windows or apertures 23 to form recesses 24 having walls 24a with the desired depth determined by the diodes to be aligned by the tool, FIG. 4. In a silicon body, the etching may be accomplished by an anisotropic etch, such as in 30% sodium hydroxide at 60° to 80°. The top protective layer 19 is then removed from the planar surface 17 such as by etching, FIG. 5. Next, the body 16 is demounted, cleaned and a second protective layer 26 formed on the planar surface 17 and the exposed walls of recesses 24, FIG. 6.

Next the bottom protective layer 20 is masked, such as by conventional photoresist technique, FIG. 7. Windows or apertures 27 are formed in the layer 20 underlying the recesses 24 extending from planar surface 17, and portions of the body 28 are exposed. The apertures or windows may be of rectangular shaped and of sufficient size to provide an anisotropic etching to a depth of 15 mils. Alignment of the underlying apertures 28 with the recesses 26 may be accomplished by use of an infra red microscope. Next, the portions of the semiconductor body 28 exposed through the mask are anisotropically etched forming bottom recesses 29, which extend from the lower planar surface 18 to contact an exposed portion 31 of the layer 26, FIG. 8.

Next the body 16 is cleaned and layers 26 and 20 are removed, FIG. 9. Next a relatively thin passivating layer 32 is formed on the exposed surfaces of the body. Layer 32 may be an oxide of the body formed to a thickness of 1 to 1.5 micrometers, FIG. 10. Next the body 16 may be dimensioned such as by scribing to provide an alignment tool having the desired diode size and diode pattern formed therein. The alignment tool may be dimensioned to a rectangular pattern 0.6 inches on each side and having the diode array pattern centered thereon.

Turning to the method for forming discrete diodes in an array, the alignment tool now fabricated is positioned in combination with an alignment tool holder 36, FIG. 11. The alignment tool 34 is placed on a lower surface 39 of the holder 36. Tool holder 36 includes a housing 38 having a lower surface 39 and having a cavity 41 extending from said lower surface 39 within the housing 38. Housing 38 has a passage 42 extending from cavity 41 through housing 38 exiting on a surface opposite surface 39. Passage 42 has a bonder pin 43 slidably mounted within passage 42. A vacuum tube 44 is in communication with cavity 41. Cavity 41 has a porous block 46 suitably positioned within said cavity. Bonder pin 43 is positioned in relation to block 46 so that when pressure means is applied to pin 43 the pin moves from a rest position to contact block 46 which transmits the force applied to pin 43 by said pressure means over the surface contacted by block 46.

In operation of the tool holder 36, alignment tool 34 is positioned over the open end of cavity 41 and resting on surface 39 and contacting porous block 46. Vacuum means is applied to vacuum tube 44 to thereby urge alignment tool 34 against surface 39 and porous block 46. Diodes 47 may now be loaded in the recesses of alignment tool 34, said diodes and tool positioned so that the diode bond pads 48 protrude from the alignment tool and extend outward from the combination of the holder 36 and the tool 34. The diodes 47 are likewise urged against the outward surface of tool 34 by the vacuum means applied to vacuum tube 44.

Diodes 47 are positioned within the alignment tool 34 with outwardly facing bond pads 48, FIG. 12. In the present invention the diode bond pad 48 metal combines with the substrate metal, yet to be described, to form a diode bond metallization, thereby bonding the diodes into an array. Two specific diode bond metallizations may be utilized, one metallization utilizing the gold-silicon eutectic and the other the gold-tin eutectic. The process used to form the diode bond pads 48 may be accomplished subsequent to the conventional formation of the diodes 47. The conventional formation of diodes 47 may be by diffusion or ion implantation of the diodes in a first surface of a semiconductor body which is then ground and polished to the desired diode thickness.

Next a relatively thick, impurity doped insulating layer is formed on the back side of the wafer, that is, the surface parallel to the planar front or first surface in which the diodes are formed. The layer may be approximately 2000 Angstroms in thickness formed of phosphorous doped silicon dioxide. The oxide may then be patterned to expose the semiconductor surface on the back of each diode. Next the diode bond pad 48 may be formed. In the case of the gold-silicon eutectic a first layer of 100 to 300 Angstroms of nickel is formed and sequentially a 1000 Angstrom layer of gold is formed on the exposed backside of the diodes. In the case of the gold-tin eutectic a layer of 100 to 300 Angstroms of titanium is first formed, and then a 1000 to 1500 Angstrom layer of platinum or molybdenum layer is formed thereon. Finally a 1000 Angstrom layer of gold is formed on the platinum or molybdenum layer. The bond pads are then conventionally masked.

Next, the gold-silicon semiconductor bodies have a 1 to 1.5 micrometer layer of gold formed thereon, such as by electroplating. The gold-tin metallization semiconductor bodies have a layer of 3 to 4 micrometers of gold formed thereon, followed by a 2 to 3 micrometer layer of tin sequentially formed thereon. Next a 1 to 1.5 micrometer layer of gold is formed on the tin layer. The photoresist is then removed and excess portions of the metals removed by etching. Next the semiconductor bodies are mounted on an inert substrate having the individual diodes exposed. The diodes are then separated, such as by anisotropic etching in 30% sodium hydroxide at 60°C, as required. The discrete diodes, having the diode bond pads 48 formed thereon, may then be demounted, cleaned and inspected; prior to their being formed into a diode array.

As previously discussed, once the diodes 47 are placed in the alignment tool 34 which has been positioned against the alignment holder 36, vacuum means urges the diodes 47 against the recesses of alignment tool. Next the plurality of diodes in the alignment tool 34 and the alignment tool holder 36, are placed in a conventional flip-flop beam lead bonding machine having vertical travel, FIG. 11. An insulating substrate 51 has a metallization layer 52 formed thereon and patterned to correspond with the diode bond pads 48 of the spaced diodes 47 positioned by alignment tool 34. Next the substrate 51 and the metallization layer 52 formed thereon are heated by the conventional bonder stage 53. The bonder stage 53 and flip-chip bonding machine are positioned to align the diode bond pads 48 and confronting, patterned metal layer 52. The metal layer 52 may be formed of gold and heated to approximately 450°C.

Next the conventional flip-chip bonding machine vertical travel is adjusted to bring the confronting diode bond pads 48 into contact with the metallization layer 52. Pressure means may then be applied to bonder pin 43. Typically 0 to 5 pounds of pressure may be applied for a period of from 5-10 seconds. Next the vacuum means is deenergized, the alignment tool holder pin 43 moved to its rest position. The bonding tool 34 and diodes 47 therein remain in contact having formed a metallization eutectic at the bond pad 48 — layer 52 interface. Next the substrate is allowed to cool to 250°C and the alignment tool 34 is then removed leaving the plurality of diodes 47 bonded to the substrate formed as a diode array thereon. Next the substrate and diode array are allowed to cool to room temperature.

Thus it is apparent that an alignment tool has been provided for positioning discrete diodes of the type having diode bond pads so that they can be bonded into an array. Further, a method for fabricating a diode array using a gold-silicon and alternatively a gold-tin eutectic is apparent. The alignment tool, the method for forming the tool and the method for forming semiconductor devices into an array provides alignment of semiconductor devices in a wide variety of applications which require precise alignment. Moreover, the present invention may be utilized to form arrays of various types of semiconductors, such as diodes transistors and photo-semiconductors, which may be scanned or activated by wide variety of optical or electron beams.

I claim:

1. In an alignment tool for positioning discrete diodes of the type having diode bond pads so they can be bonded into an array, a semiconductor body having substantially parallel top and bottom planar surfaces, said top surface of the body having a plurality of spaced top recesses formed therein having walls forming alignment surfaces extending from the top surface into the body, wherein said alignment surfaces and said diode body in combination mutually co-act to position said diodes, said recesses being adapted to receive the diode body and having a predefined depth so that the diode bond pads protrude above the top surface of the body, said bottom surface of the body having a plurality of spaced bottom recesses formed therein underlying the top recesses and having walls extending from the bottom surface into the body and intersecting the walls of the top recesses.

2. An alignment tool as in claim 1 wherein the semiconductor body is a silicon body, the outer peripheries of the top recesses in the top surface are spaced a distance of 1 mil or greater, and where the intersection of the top and bottom recesses defines a subsurface plane substantially parallel to said top and bottom surfaces, and wherein the walls of the bottom recesses intersect the subsurface plane entirely within the intersection of the walls of the top recesses and the subsurface to thereby form a shoulder within the body.

3. An alignment tool as in claim 2 wherein said top recesses are rectangular in shape in the top surface and have downward inwardly tapering walls, said bottom recesses are rectangular in shape in the bottom surface and have upward inwardly tapering walls, and wherein said tool has a relatively thin passivating layer formed as an oxide of the body on the alignment surfaces of said recesses and on the exposed surfaces of the body.

4. In an alignment tool for positioning discrete diodes of the type have diode bond pads so they can be bonded into an array, a semiconductor body having substantially parallel top and bottom planar surfaces, said top surface of the body having a plurality of spaced top recesses formed therein having walls extending from the top surface into the body and adapted to receive the diode body with the diode bond pads protruding above the top surface of the body, said bottom surface of the body having a plurality of spaced bottom recesses formed therein underlying the top recesses and having walls extending from the bottom surface into the body and intersecting the walls of the top recesses, said walls of the top recesses defining a smaller area within said body than the area defined by said walls of the top recesses at said top surfaces.

* * * * *